United States Patent
Larsen et al.

(10) Patent No.: US 9,970,999 B2
(45) Date of Patent: May 15, 2018

(54) NUCLEAR MAGNETIC RESONANCE PROBE SYSTEM

(71) Applicants: Michael S. Larsen, Woodland Hills, CA (US); Henry C. Abbink, Westlake Village, CA (US); Thad G. Walker, Madison, WI (US); Michael D. Bulatowicz, Canoga Park, CA (US)

(72) Inventors: Michael S. Larsen, Woodland Hills, CA (US); Henry C. Abbink, Westlake Village, CA (US); Thad G. Walker, Madison, WI (US); Michael D. Bulatowicz, Canoga Park, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 1385 days.

(21) Appl. No.: 13/907,293

(22) Filed: May 31, 2013

(65) Prior Publication Data
US 2013/0328557 A1    Dec. 12, 2013

Related U.S. Application Data

(60) Provisional application No. 61/656,299, filed on Jun. 6, 2012.

(51) Int. Cl.
*G01R 33/26* (2006.01)
*G01R 33/32* (2006.01)
*G01C 19/62* (2006.01)

(52) U.S. Cl.
CPC .............. *G01R 33/26* (2013.01); *G01C 19/62* (2013.01); *G01R 33/323* (2013.01)

(58) Field of Classification Search
CPC .... G01R 33/26; G01R 33/323; G01R 33/032; G01R 33/0322; G01R 33/282; G01C 19/62; G01C 19/60; G01N 24/08; G01N 24/006
(Continued)

(56) References Cited

U.S. PATENT DOCUMENTS 8,212,556 B1    7/2012  Schwindt et al.

OTHER PUBLICATIONS

Pustelny, S., et al. "Pump-probe nonlinear magneto-optical rotation with frequency-modulated light." Physical Review A 73.2 (2006): 023817.*

(Continued)

*Primary Examiner* — Rishi Patel
(74) *Attorney, Agent, or Firm* — Tarolli, Sundheim, Covell & Tummino LLP

(57) ABSTRACT

One embodiment includes a nuclear magnetic resonance (NMR) sensor system. The system includes a pump laser configured to generate an optical pump beam at a first wavelength and a probe laser configured to generate an optical probe beam at a second wavelength that is different from the first wavelength. The system also includes beam optics configured to direct the pump laser and the probe laser along orthogonal axes through a sensor cell comprising an alkali metal vapor. The system further includes detection optics that include a photodetector assembly configured to measure at least one characteristic associated with the optical probe beam leaving the sensor cell for measurement of a polarization vector of the alkali metal vapor. The detection optics can include at least one filter configured to filter light having the first wavelength and to pass light having the second wavelength to the photodetector assembly.

16 Claims, 4 Drawing Sheets

(58) Field of Classification Search
USPC .......................... 324/244, 300, 301, 304, 305
See application file for complete search history.

(56) References Cited

OTHER PUBLICATIONS

Kimball, DF Jackson, et al. "Magnetometric sensitivity optimization for nonlinear optical rotation with frequency-modulated light: Rubidium D2 line." Journal of Applied Physics 106.6 (2009): 063113.*

* cited by examiner

NUCLEAR MAGNETIC RESONANCE PROBE SYSTEM

RELATED APPLICATIONS

The present invention claims priority from U.S. Provisional Patent Application No. 61/656,299, entitled "NUCLEAR MAGNETIC RESONANCE PROBE SYSTEM", filed Jun. 6, 2012, which is incorporated herein by reference in their entirety.

TECHNICAL FIELD

The present invention relates generally to sensor systems, and specifically to a nuclear magnetic resonance probe system.

BACKGROUND

Nuclear magnetic resonance (NMR) sensors, such as gyroscopes and magnetometers, employ optical beams to operate, such as to detect rotation about a sensitive axis or to detect the presence and magnitude of an external magnetic field. As an example, an NMR sensor system can employ a first optical beam as a pump beam. For example, the pump beam can be a circularly-polarized optical beam that is configured to spin-polarize an alkali metal vapor, such as cesium (Cs) or rubidium (Rb), within a sealed cell of the sensor. The NMR sensor system can also employ a second optical beam as a probe beam. For example, the probe beam can be a linearly-polarized optical beam that is configured to indirectly detect precession of noble gas isotopes, such as xenon (Xe), based on the directly measured precession of the alkali metal, such as for detecting rotation of the detection system about the sensitive axis or detecting the magnitudes of the external magnetic field.

SUMMARY

One embodiment includes a nuclear magnetic resonance (NMR) sensor system. The system includes a pump laser configured to generate an optical pump beam at a first wavelength and a probe laser configured to generate an optical probe beam at a second wavelength that is different from the first wavelength. The system also includes beam optics configured to direct the pump laser and the probe laser along orthogonal axes through a sensor cell comprising an alkali metal vapor. The system further includes detection optics that include a photodetector assembly configured to measure at least one characteristic associated with the optical probe beam leaving the sensor cell for measurement of a polarization vector of the alkali metal vapor. The detection optics can include at least one filter configured to filter light having the first wavelength and to pass light having the second wavelength to the photodetector assembly.

Another embodiment includes a method for measuring an external magnetic field in a nuclear magnetic resonance system. The method includes generating an optical pump beam at a first wavelength corresponding to one of a D1 emission line and a D2 emission line associated with an alkali metal vapor via a pump laser. The method also includes generating an optical probe beam at a second wavelength corresponding to the other of the D1 emission line and the D2 emission line associated with the alkali metal vapor via a probe laser. The method also includes directing the optical pump beam and the optical probe beam along orthogonal axes through a sensor cell comprising the alkali metal vapor. The method also includes filtering light having the first wavelength to pass light having the second wavelength to a photodetector assembly. The method further includes measuring a Faraday rotation associated with the optical probe beam leaving the sensor cell via the photodetector assembly. The Faraday rotation can be associated with the external magnetic field.

Another embodiment includes an NMR sensor system. The system includes a sensor cell comprising an alkali metal vapor. The system also includes a pump laser configured to generate an optical pump beam at a first wavelength corresponding to one of a D1 emission line and a D2 emission line associated with the alkali metal vapor. The system also includes a probe laser configured to generate an optical probe beam at a second wavelength corresponding to the other of the D1 emission line and the D2 emission line associated with the alkali metal vapor. The system also includes beam optics. The beam optics includes a linear polarizer and a quarter-wave plate configured to convert the optical pump beam to a circular polarization. The beam optics also includes a linear polarizer configured to convert the optical probe beam to a linear polarization. The beam optics further includes additional optics configured to direct the optical pump beam and the optical probe beam along orthogonal axes through the sensor cell. The system further includes detection optics comprising a photodetector assembly configured to measure a Faraday rotation associated with the optical probe beam leaving the sensor cell for measurement of a polarization vector of the alkali metal vapor. The detection optics can include at least one filter configured to filter light having the first wavelength and to pass light having the second wavelength to the photodetector assembly.

DETAILED DESCRIPTION

The present invention relates generally to sensor systems, and specifically to a nuclear magnetic resonance (NMR) probe system. The NMR probe system can be implemented with an NMR sensor, such as an NMR gyroscope or an atomic magnetometer. The NMR probe system includes a pump laser configured to generate an optical pump beam and a probe laser configured to generate an optical probe beam. As an example, the optical pump beam can be generated at a first wavelength, such as corresponding to one of a D1 or D2 emission line associated with an alkali metal vapor that is encapsulated within a sensor cell of the associated NMR sensor system. As another example, the optical probe beam can be generated at a second wavelength, such as corresponding to the other of the D1 and D2 emission line associated with the alkali metal vapor. The optical pump beam can be provided through the sensor cell, such as via beam optics, to stimulate the alkali metal vapor therein, and the optical probe beam can be provided through the sensor cell to measure a Faraday rotation of the optical probe beam in response to polarization of the alkali metal vapor, which can be modulated in response to precession of noble gas isotopes based on the interaction of the alkali metal vapor with the noble gas isotopes.

The Faraday rotation of the optical probe beam can be measured by detection optics, such as including one or more photodetectors. Because the optical probe beam is detuned relative to the optical pump beam, the detection optics can include one or more optical filters that are configured to filter the first wavelength and to pass the second wavelength. As a result, the detection optics can be configured to substantially mitigate noise associated with spurious emissions at the first wavelength from the sensor cell at the one or more photodetectors. In addition, the separation of the wavelengths between the optical pump beam and the optical probe beam can result in additional optical configurations of the beam optics and/or detection optics. For example, at least a portion of the optical probe beam can be provided in a collinear manner with respect to the optical pump beam for stabilizing the polarization-density product of the polarized alkali metal vapor within the sensor cell. As another example, a plurality of optical probe beams can be implemented at each of the first and second wavelength, such as to substantially mitigate deleterious effects of an AC Stark shift.

Figure 1:
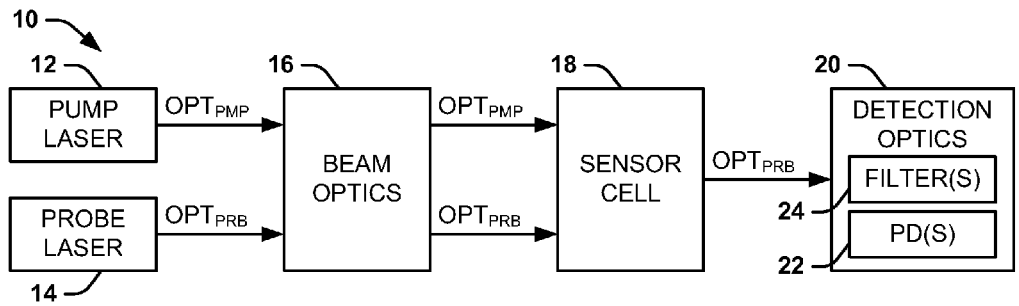
FIG. 1 illustrates an example of a nuclear magnetic resonance (NMR) sensor system.

FIG. 1 illustrates an example of a nuclear magnetic resonance (NMR) sensor system 10. The NMR sensor system 10 can correspond to any of a variety of NMR sensors, such as an NMR gyroscope that is configured to measure rotation about a sensitive axis or an atomic magnetometer that is configured to measure a magnitude of an externally provided magnetic field. The NMR sensor system 10 can thus be provided in any of a variety of applications, such as navigation and/or defense applications.

The NMR sensor system 10 includes a pump laser 12 configured to generate an optical pump beam $OPT_{PMP}$ and a probe laser 14 configured to generate an optical probe beam $OPT_{PRB}$. The optical pump beam $OPT_{PMP}$ can be generated at a first wavelength, such as corresponding to either a D1 or a D2 emission line associated with an alkali metal vapor, and the optical probe beam $OPT_{PRB}$ can be generated at a second wavelength, such as corresponding to the other of the D1 or D2 emission line associated with the alkali metal vapor. The optical pump beam $OPT_{PMP}$ and the optical probe beam $OPT_{PRB}$ are each provided to a set of beam optics 16 that is configured to direct each of the optical pump beam $OPT_{PMP}$ and the optical probe beam $OPT_{PRB}$ into a sensor cell 18. For example, the set of beam optics 16 can provide the optical pump beam $OPT_{PMP}$ and the optical probe beam $OPT_{PRB}$ along orthogonal axes with respect to each other through the sensor cell 18. In addition, the set of beam optics 16 can include polarization components configured to polarize (e.g., circularly polarize) the optical pump beam $OPT_{PMP}$ and to polarize (e.g., linearly polarize) the optical probe beam $OPT_{PRB}$.

As an example, the sensor cell 18 can be configured as a sealed cell having a transparent or translucent casing that includes an alkali metal vapor (e.g., cesium (Cs) or rubidium (Rb)) and can include a noble gas isotope (e.g., argon (Ar) or xenon (Xe)). The first and second wavelengths could thus correspond to the respective D1 and D2 emission lines of the alkali metal vapor in the sensor cell 18. The sensor cell 18 can thus comprise the operative physics portion of the NMR sensor system 10. Specifically, the optical pump beam $OPT_{PMP}$ can be provided through the sensor cell 18 to spin-polarize the alkali metal vapor therein. As an example, noble gas isotopes within the sensor cell 18 can precess in the presence of an external magnetic field, such that the spin-polarized alkali metal vapor particles can have their spin-polarization modulated such that a component of the net spin polarization is aligned with the precessing noble gas isotopes. The precession of the noble gas isotopes can thus be measured by the optical probe beam $OPT_{PRB}$, such as based on measuring a Faraday rotation of the linearly polarized optical probe beam $OPT_{PRB}$ exiting the sensor cell 18. Accordingly, a rotation of the sensor system 10 or a magnitude of an external magnetic field can be measured in response to determining the precession of the noble gas isotopes.

The NMR sensor system 10 also includes detection optics 20 that are configured to receive the optical probe beam $OPT_{PRB}$ exiting the sensor cell 18 and to measure at least one characteristic associated with the optical probe beam $OPT_{PRB}$. For example, the at least one characteristic can include a Faraday rotation associated with the optical probe beam $OPT_{PRB}$ exiting the sensor cell 18, as described previously. In the example of FIG. 1, the detection optics 20 includes at least one photodetector 22, demonstrated in the example of FIG. 1 as PD(S) 22, and at least one filter 24. The photodetector(s) 22 can be configured to measure the at least one characteristic of the optical probe beam $OPT_{PRB}$ exiting the sensor cell 18. For example, the detection optics 20 could include a polarizing beamsplitter configured to separate the optical probe beam $OPT_{PRB}$ into orthogonally polarized components. Therefore, the photodetector(s) 22 can measure a relative separate intensity of the orthogonally polarized components to determine the Faraday rotation of the optical probe beam $OPT_{PRB}$ exiting the sensor cell 18. In addition, the detection optics 20 also include at least one filter 24 that is configured to filter light having the first wavelength from entering the photodetector(s) 22. Therefore, noise resulting from spurious optical emissions having the first wavelength (e.g., from the optical pump beam $OPT_{PMP}$) emanating from the sensor cell 18 can be substantially mitigated in measuring the at least one characteristic associated with the optical probe beam $OPT_{PRB}$.

Therefore, by generating the optical pump beam $OPT_{PMP}$ and the optical probe beam $OPT_{PRB}$ at different wavelengths, the light from the respective pump laser 12 and probe laser 14 can be segregated in the NMR sensor system 10, particularly within the sensor cell 18 and at the detection optics 20. For example, the segregation of the light from the respective pump laser 12 and probe laser 14 allows the implementation of the filter(s) 24 at the detection optics 20. Therefore, because the light having the first wavelength, such as scattered from the optical pump beam $OPT_{PMP}$, can be filtered from the photodetector(s) 22 via the filter 24, the at least one characteristic of the optical probe beam $OPT_{PRB}$ can be more accurately determined based on mitigating noise associated with the light having the first wavelength. In addition, the beam optics 16 and the detection optics 20 can be configured in a manner in which the light from the optical pump beam $OPT_{PMP}$ and the optical probe beam $OPT_{PRB}$ can be combined to provide for improved functionality of the NMR sensor system 10, as described in greater detail herein.

Figure 2:
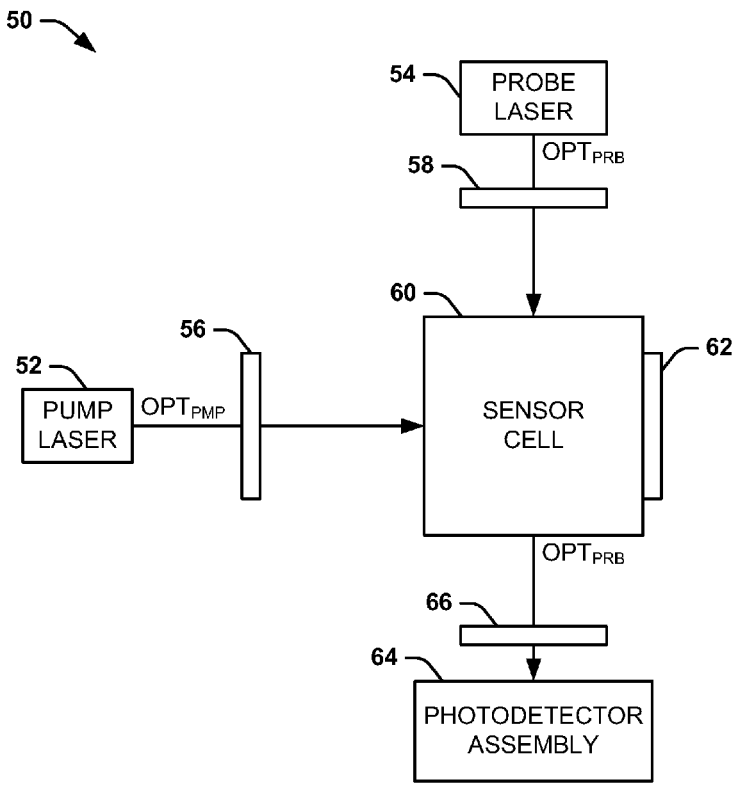
FIG. 2 illustrates another example of an NMR sensor system.

FIG. 2 illustrates another example of an NMR sensor system 50. As an example, the NMR sensor system 50 can correspond to a portion of an NMR gyroscope system or an atomic magnetometer.

The NMR sensor system 50 includes a pump laser 52 configured to generate an optical pump beam $OPT_{PMP}$ and a probe laser 54 configured to generate an optical probe beam $OPT_{PRB}$. As an example, the pump laser 52 and the probe laser 54 can each include collimating optics to generate the respective optical pump beam $OPT_{PMP}$ and optical probe beam $OPT_{PRB}$. The optical pump beam $OPT_{PMP}$ can be generated at a first wavelength, such as corresponding to a D1 emission line associated with an alkali metal vapor, and the optical probe beam $OPT_{PRB}$ can be generated at a second wavelength, such as corresponding to a D2 emission line associated with the alkali metal vapor. For example, the first wavelength can be approximately 795 nm and the second wavelength can be approximately 780 nm, thus corresponding to the respective D1 and D2 emission lines of Rb. Alternatively, the first wavelength could correspond to the D2 emission line of Rb and the second wavelength could correspond to the D1 emission line of Rb. The optical pump beam $OPT_{PMP}$ is provided to a polarizer 56 that is configured to convert the optical pump beam $OPT_{PMP}$ to a circular polarization. As an example, the polarizer 56 can include a linear polarizer followed by a quarter-wave plate that can convert the optical pump beam $OPT_{PMP}$ to the circular polarization. The optical probe beam $OPT_{PRB}$ is provided to a polarizer 58 that can be configured as a linear polarizer configured to convert the optical probe beam $OPT_{PRB}$ to a linear polarization. In the example of FIG. 2, the polarizers 56 and 58 can correspond to the set of beam optics 16 in the example of FIG. 1. However, while the optical pump beam $OPT_{PMP}$ and the optical probe beam $OPT_{PRB}$ are demonstrated as being provided to a sensor cell 60 orthogonally with respect to each other in the example of FIG. 2, it is to be understood that the NMR sensor system 50 could include additional optics to direct the respective optical beams to such an orientation.

As an example, the sensor cell 60 can include an alkali metal vapor and a noble gas isotope, similar to as described previously in the example of FIG. 1. The first and second wavelengths could thus correspond to the respective D1 and D2 emission lines of the alkali metal vapor in the sensor cell 60. Similar to as described previously, the optical pump beam $OPT_{PMP}$ can be provided through the sensor cell 60 to spin-polarize the alkali metal vapor therein. In the example of FIG. 2, the NMR sensor system 50 also includes a mirror 62 at a distal end of the sensor cell 60 to reflect the optical pump beam $OPT_{PMP}$ back through the sensor cell 60, such as to stabilize the optical pump beam $OPT_{PMP}$ based on a feedback detection optics (not shown). The linearly-polarized optical probe beam $OPT_{PRB}$ can experience a Faraday rotation as it passes through the sensor cell 60 based on the spin polarization vector components of the alkali metal vapor, with the modulation of such Faraday rotation corresponding to the precession of the noble gas isotopes in the sensor cell 60.

The NMR sensor system 50 also includes a photodetector assembly 64 that is configured to receive the optical probe beam $OPT_{PRB}$ exiting the sensor cell 60. As an example, the photodetector assembly 64 can include a polarizing beamsplitter configured to separate the optical probe beam $OPT_{PRB}$ exiting the sensor cell 60 into orthogonal polarizations and a photodiode associated with each orthogonal polarization. Therefore, the photodetector assembly 64 can be configured to determine a Faraday rotation associated with the optical probe beam $OPT_{PRB}$ exiting the sensor cell 60 based on a relative intensity of the respective orthogonal polarization components of the optical probe beam exiting the sensor cell 60.

In addition, the NMR sensor system 50 can include a filter 66 arranged in an optical path of the optical probe beam $OPT_{PRB}$ between the sensor cell 60 and the photodetector assembly 64. As an example, the filter 66 and the photodetector assembly 64 can collectively correspond to the detection optics 20 in the example of FIG. 1. The filter 66 can be configured as a narrowband pass filter that is configured to pass only light that has a wavelength that is approximately at the D2 emission line of the alkali metal vapor in the sensor cell 60. Therefore, the filter 66 can be configured to substantially prohibit light outside of the approximate wavelength of the D2 emission line from being received at the photodetector assembly 64. Accordingly, spurious optical emissions having a wavelength at approximately the D1 emission line that are emitted from the sensor cell 60, such as scattered from the optical pump beam $OPT_{PMP}$ within the sensor cell 60, are substantially prohibited from being received at the photodetector assembly 64.

Based on the filtering of the light having the first wavelength from the photodetector assembly 64, noise in the measurement of the Faraday rotation of the optical probe beam $OPT_{PRB}$ exiting the sensor cell 60 can be substantially mitigated. Thus, the signal-to-noise ratio (SNR) of the detection of the Faraday rotation of the optical probe beam $OPT_{PRB}$ can be substantially increased. In addition, for a given alkali metal vapor, light having a wavelength at approximately the D2 emission line can experience a greater polarization-dependent index of refraction (birefringence effect) with respect to a given alkali metal vapor net spin polarization vector and number density while passing through the alkali metal vapor, which can, in the example of Rb, result in an approximate doubling of the Faraday rotation of the optical probe beam $OPT_{PRB}$ exiting the sensor cell 60. Accordingly, based on the increase of the SNR in detecting the Faraday rotation of the optical probe beam $OPT_{PRB}$ and based on the approximate doubling of the Faraday rotation of the optical probe beam $OPT_{PRB}$ exiting the sensor cell 60, the intensity of the probe laser 54 can be substantially reduced relative to a probe laser for a typical NMR sensor system. Accordingly, the NMR sensor system 50 can be implemented to achieve more accurate results and/or operate at a substantially reduced power relative to typical NMR sensor systems.

It is to be understood that the NMR sensor system 50 is not limited to the example of FIG. 2. As an example, the NMR sensor system 50 is demonstrated as a portion of an overall sensor system for simplicity, and can thus include a variety of additional components, such as magnetic field generators, mechanization controllers, and/or other components. As another example, the NMR sensor system 50 is not limited to the optical paths demonstrated for the optical pump beam $OPT_{PMP}$ and the optical probe beam $OPT_{PRB}$, but can included additional optics for directing the respective optical beams in varying directions. Therefore, the NMR sensor system 50 can be configured in a variety of ways.

Figure 3:
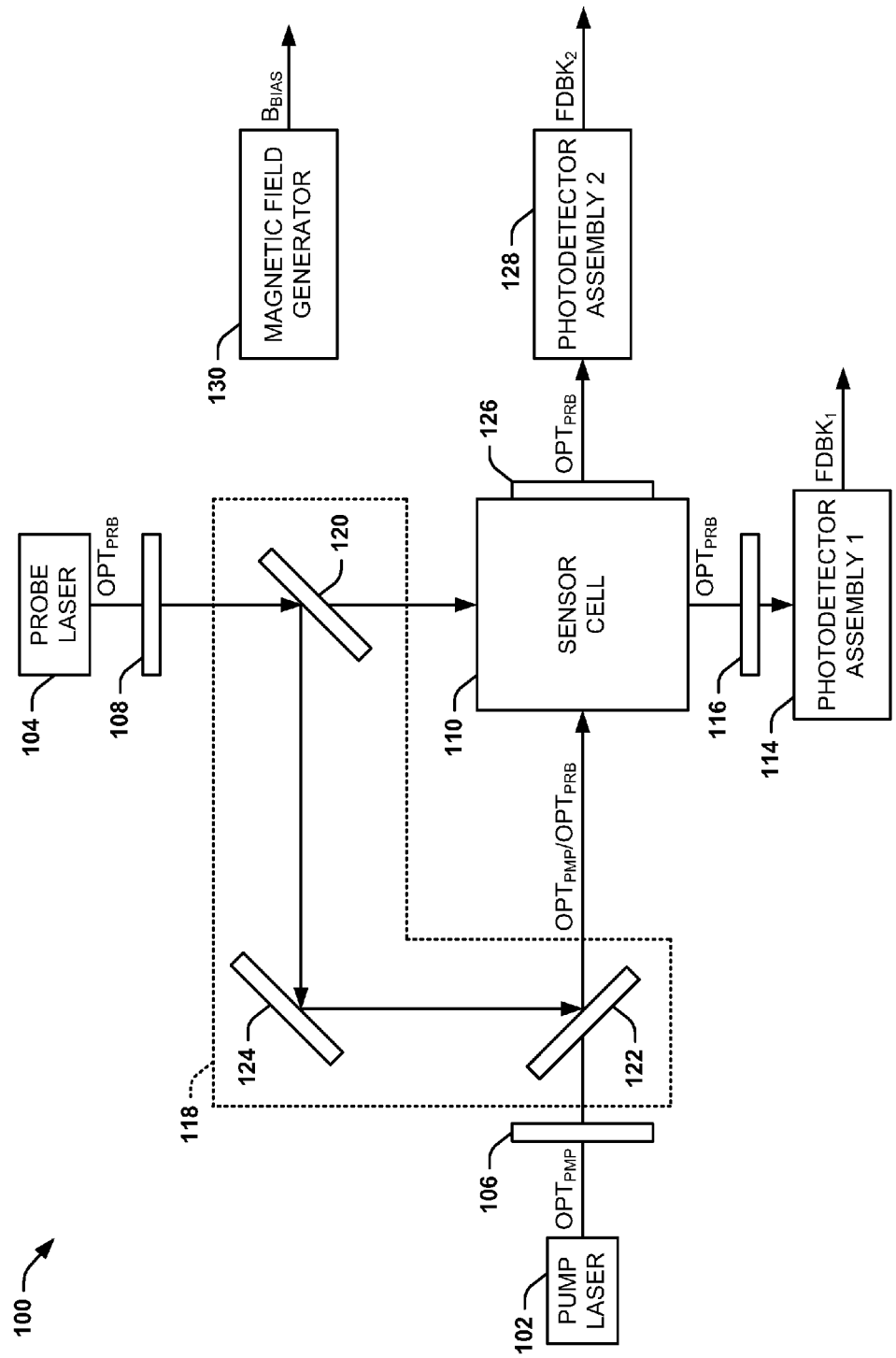
FIG. 3 illustrates yet another example of an NMR sensor system.

FIG. 3 illustrates yet another example of an NMR sensor system 100. As an example, the NMR sensor system 100 can correspond to a portion of an NMR gyroscope system or an atomic magnetometer.

The NMR sensor system 100 is configured substantially similar to the NMR sensor system 50 in the example of FIG. 2. Specifically, the NMR sensor system 100 includes a pump laser 102 configured to generate an optical pump beam $OPT_{PMP}$ and a probe laser 104 configured to generate an optical probe beam $OPT_{PRB}$ at the respective first and second wavelengths (e.g., corresponding to approximately the respective D1 and D2 emission lines associated with the alkali metal vapor). The NMR sensor system 100 also includes a polarizer 106 and a polarizer 108 configured to convert the optical pump beam $OPT_{PMP}$ to a circular polarization and the optical probe beam $OPT_{PRB}$ to a linear polarization, respectively. The polarized optical pump beam $OPT_{PMP}$ and a portion of the polarized optical probe beam $OPT_{PRB}$ are provided to a sensor cell 110.

As an example, the sensor cell 110 can include an alkali metal vapor and a noble gas isotope, similar to as described previously in the example of FIG. 1. Similar to as described previously, the optical pump beam $OPT_{PMP}$ can be provided through the sensor cell 110 to spin-polarize the alkali metal vapor therein. The portion of the linearly-polarized optical probe beam $OPT_{PRB}$ can experience a Faraday rotation as it passes through the sensor cell 110 based on the net spin polarization vector of the alkali metal vapor, with modulation of such Faraday rotation corresponding to the precession of the noble gas isotopes in the sensor cell 110, similar to as described previously. Therefore, the Faraday rotation of the portion of the optical probe beam $OPT_{PRB}$ exiting the sensor cell 110 can be measured by a first photodetector assembly 114. In addition, the NMR sensor system 100 can include a filter 116 arranged in an optical path of the portion of the optical probe beam $OPT_{PRB}$ between the sensor cell 110 and the first photodetector assembly 114 to substantially prohibit light outside of the approximate wavelength of the D2 emission line from being received at the first photodetector assembly 114. Accordingly, spurious optical emissions having a wavelength at approximately the D1 emission line that are emitted from the sensor cell 110, such as scattered from the optical pump beam $OPT_{PMP}$ within the sensor cell 110, are substantially prohibited from being received at the first photodetector assembly 114.

In addition, the NMR sensor system 100 includes a beam combiner 118 configured to combine a portion of the optical probe beam $OPT_{PRB}$ with the optical pump beam $OPT_{PMP}$ in the same optical path. Therefore, the portion of the optical probe beam $OPT_{PRB}$ and the optical pump beam $OPT_{PMP}$ can be provided substantially collinearly through the sensor cell 110. As an example, the beam combiner 118 can be included in the set of beam optics 16 in the example of FIG. 1. In the example of FIG. 3, the beam combiner 118 includes an optical pickoff 120 that is configured to separate the optical probe beam $OPT_{PRB}$ into the two portions, such that a first portion of the optical probe beam $OPT_{PRB}$ passes through the sensor cell 110, as described previously. As an example, the optical pickoff 120 can be configured as a partially-reflecting mirror, a polarization-sensitive beam-splitter, or any of a variety of polarization-insensitive beam-splitters. The other portion of the optical probe beam $OPT_{PRB}$ is reflected to a dichromatic mirror 122 via a mirror 124 that is arranged in the optical path of the optical pump beam $OPT_{PMP}$. Therefore, the optical pump beam $OPT_{PMP}$ and the optical probe beam $OPT_{PRB}$ are provided through the sensor cell 110 substantially collinearly.

In the example of FIG. 3, the NMR sensor system 100 also includes a dichromatic mirror 126 that is arranged at a distal end of the sensor cell 110. The dichromatic mirror 126 can be configured to reflect light having the first wavelength (e.g., at approximately the D1 emission line) and to pass light having the second wavelength (e.g., at approximately the D2 emission line). Therefore, the dichromatic mirror 126 is configured to reflect the optical pump beam $OPT_{PMP}$ back through the sensor cell 110, such as to stabilize the optical pump beam $OPT_{PMP}$, and to pass the collinear portion of the optical probe beam $OPT_{PRB}$ through the dichromatic mirror 126 to a second photodetector assembly 128.

As an example, the second photodetector assembly 128 can be configured substantially similar to the first photodetector assembly 114, such as including a polarizing beam-splitter configured to separate the collinear portion of the optical probe beam $OPT_{PRB}$ exiting the sensor cell 110 into orthogonal polarizations and a photodiode associated with each orthogonal polarization. Therefore, similar to the first photodetector assembly 114, the second photodetector assembly 128 can be configured to measure a Faraday rotation associated with the collinear portion of the optical probe beam $OPT_{PRB}$. In the example of FIG. 3, the NMR sensor system 100 further includes a magnetic field generator 130 configured to generate a bias magnetic field $B_{BIAS}$ that is provided through the sensor cell 110 in a direction that is substantially parallel with the optical pump beam $OPT_{PMP}$ and the collinear portion of the optical probe beam $OPT_{PRB}$. The bias magnetic field $B_{BIAS}$ can be configured to stimulate precession of the alkali metal vapor in the sensor cell 110 in a resonant condition to substantially amplify the modulation of the polarization vector of the alkali metal vapor in the sensor cell 110 in response to magnetic fields applied orthogonally with respect to the optical pump beam $OPT_{PMP}$ (e.g., external orthogonal magnetic field components). Therefore, in response to the measured Faraday rotation associated with the portion of the optical probe beam $OPT_{PRB}$ at the first photodetector assembly 114, the first photodetector assembly 114 and associated signal processing electronics (not shown) can adjust the magnetic fields orthogonal to the optical pump beam $OPT_{PMP}$ in a closed-loop feedback manner based on a signal $FDBK_1$, such that these orthogonal magnetic fields are maintained at substantially zero magnetic flux.

Furthermore, the collinear portion of the optical probe beam $OPT_{PRB}$ can undergo a Faraday rotation based on the net alkali spin polarization vector component parallel to the collinear optical probe beam $OPT_{PRB}$. This net spin polarization vector can be aligned to the magnetic field. As a result, the closed-loop feedback maintaining the orthogonal magnetic fields at substantially zero can ensure that the net spin polarization vector remains substantially oriented parallel to the optical pump beam $OPT_{PMP}$ and the collinear portion of the optical probe beam $OPT_{PRB}$. The magnitude of the net spin vector can further be proportional to the alkali metal vapor number density and fractional polarization. The feedback signal $FDBK_2$ can be generated based on the Faraday rotation measured by photodetector assembly 128 to adjust at least one of the cell temperature, optical pump beam intensity, or intensity and/or wavelength of the optical probe beam $OPT_{PRB}$. Accordingly, the Faraday rotation associated with the collinear portion of the optical probe beam $OPT_{PRB}$ can be measured to substantially stabilize the product of the net spin polarization and number density associated with the alkali metal vapor inside the sensor cell 110 in a closed-loop feedback manner.

As an example, the Faraday rotation of the optical probe beam $OPT_{PRB}$ having a collinear relationship with the optical pump beam $OPT_{PMP}$ can be associated with a proportional relationship between the product of spin polarization and number density of the alkali metal vapor. The internal magnetic field of the alkali metal vapor, including said field as perceived by the NMR isotopes, will be proportional to the product of spin polarization and number density of the alkali metal vapor. Therefore, the Faraday rotation of the optical probe beam $OPT_{PRB}$ having a collinear relationship with the optical pump beam $OPT_{PMP}$ can be measured to calculate the internal magnetic field, such that the calculated internal magnetic field can be canceled from a calculation of an external magnetic field (i.e., in an atomic magnetometer) or from a calculation of rotation of the sensor cell (i.e., in an NMR gyroscope). Accordingly, the NMR sensor system 100 can be implemented to provide substantially more accurate measurements of external magnetic field or rotation based on the generation of the optical pump beam $OPT_{PMP}$ and the optical probe beam $OPT_{PRB}$ at the separate wavelengths, as described herein.

Figure 4:
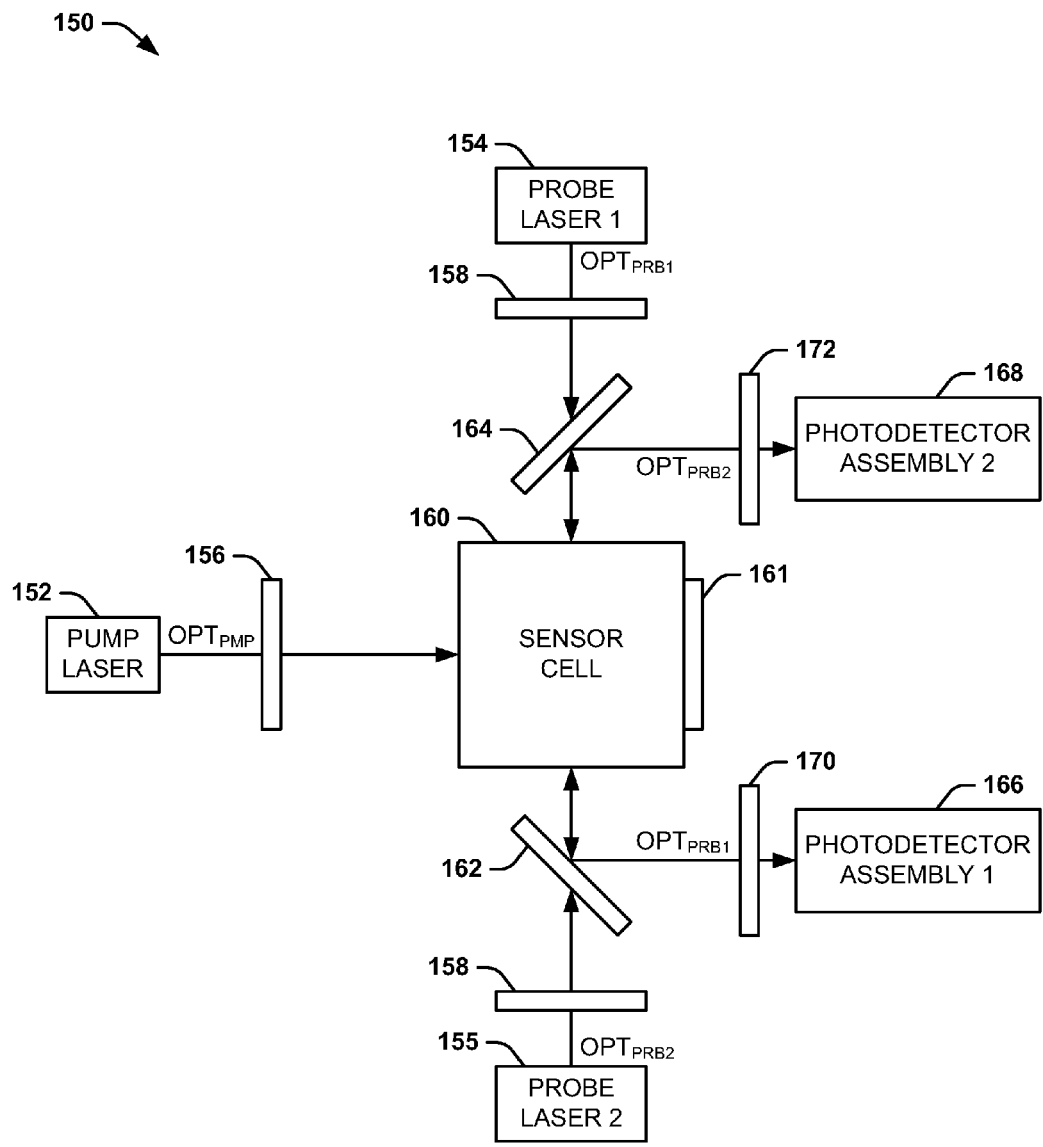
FIG. 4 illustrates yet a further example of an NMR sensor system.

FIG. 4 illustrates yet a further example of an NMR sensor system 150. As an example, the NMR sensor system 150 can correspond to a portion of an NMR gyroscope system or an atomic magnetometer.

The NMR sensor system 150 includes a pump laser 152 configured to generate an optical pump beam $OPT_{PMP}$, a first probe laser 154 configured to generate a first optical probe beam $OPT_{PRB1}$, and a second probe laser 155 configured to generate a second optical probe beam $OPT_{PRB2}$. As an example, the optical pump beam $OPT_{PMP}$ and the second optical probe beam $OPT_{PRB2}$ can be generated at a first wavelength, such as corresponding to a D1 emission line associated with an alkali metal vapor, and the first optical probe beam $OPT_{PRB1}$ can be generated at a second wavelength, such as corresponding to a D2 emission line associated with the alkali metal vapor. For example, the second probe laser 155 can generate the second optical probe beam $OPT_{PRB2}$ at approximately twice the intensity of the first optical probe beam $OPT_{PRB1}$. The optical pump beam $OPT_{PMP}$ is provided to a polarizer 156 that is configured to convert the optical pump beam $OPT_{PMP}$ to a circular polarization, and each of the optical probe beams $OPT_{PRB1}$ and $OPT_{PRB2}$ are provided to respective polarizers 158 that are configured to convert the respective optical probe beams $OPT_{PRB1}$ and $OPT_{PRB2}$ to a linear polarization. In the example of FIG. 4, the optical probe beams $OPT_{PRB1}$ and $OPT_{PRB2}$ are provided through a sensor cell 160 substantially collinearly with respect to each other as counter-propagating waves in an optical path that is orthogonal to an optical path of the optical pump beam $OPT_{PMP}$. In the example of FIG. 4, the NMR sensor system 150 also includes a mirror 161 at a distal end of the sensor cell 160 to reflect the optical pump beam $OPT_{PMP}$ back through the sensor cell 160, such as to stabilize the optical pump beam $OPT_{PMP}$ based on feedback detection optics (not shown).

As an example, the sensor cell 160 can include an alkali metal vapor and a noble gas isotope, similar to as described previously in the example of FIG. 1. Similar to as described previously, the optical pump beam $OPT_{PMP}$ can be provided through the sensor cell 160 to spin-polarize the alkali metal vapor therein. The linearly-polarized optical probe beams $OPT_{PRB1}$ and $OPT_{PRB2}$ can each experience a Faraday rotation as they pass through the sensor cell 160 based on the net spin polarization vector components of the alkali metal vapor, with modulation of such Faraday rotation corresponding to the precession of the noble gas isotopes in the sensor cell 160, similar to as described previously.

In the example of FIG. 4, the first optical probe beam $OPT_{PRB1}$ is provided to a first dichromatic mirror 162 in the optical path of the optical probe beams $OPT_{PRB1}$ and $OPT_{PRB2}$ as it exits the sensor cell 160. The first dichromatic mirror 162 can be configured to reflect light having the second wavelength (e.g., at approximately the D2 emission line) and to pass light having the first wavelength (e.g., at approximately the D1 emission line). Therefore, the first dichromatic mirror 162 can pass the second optical probe beam $OPT_{PRB2}$ to the sensor cell 160 and can reflect the first optical probe beam $OPT_{PRB1}$ exiting the sensor cell 160. Similarly, the second optical probe beam $OPT_{PRB2}$ is provided to a second dichromatic mirror 164 in the optical path of the optical probe beams $OPT_{PRB1}$ and $OPT_{PRB2}$ as it exits the sensor cell 160. The second dichromatic mirror 162 can be configured to reflect light having the first wavelength and to pass light having the second wavelength. Therefore, the second dichromatic mirror 164 can pass the first optical probe beam $OPT_{PRB1}$ to the sensor cell 160 and can reflect the second optical probe beam $OPT_{PRB2}$ exiting the sensor cell 160.

Based on the dichromatic mirrors 162 and 164, the Faraday rotation of the optical probe beams $OPT_{PRB1}$ and $OPT_{PRB2}$ exiting the sensor cell 160 can be measured by a first photodetector assembly 166 and a second photodetector assembly 168. The NMR sensor system 100 includes a first filter 170 arranged in an optical path of the first optical probe beam $OPT_{PRB1}$ between the first dichromatic mirror 162 and the first photodetector assembly 166 to substantially prohibit light outside of the approximate wavelength of the D2 emission line from being received at the first photodetector assembly 166. Similarly, the NMR sensor system 100 includes a second filter 172 arranged in an optical path of the second optical probe beam $OPT_{PRB2}$ between the second dichromatic mirror 164 and the second photodetector assembly 168 to substantially prohibit light outside of the approximate wavelength of the D1 emission line from being received at the second photodetector assembly 168. Therefore, the photodetector assemblies 166 and 168 can each independently measure a Faraday rotation of the respective optical probe beams $OPT_{PRB1}$ and $OPT_{PRB2}$.

Based on the counter-propagating optical probe beams $OPT_{PRB1}$ and $OPT_{PRB2}$, the NMR sensor system 150 can be configured to substantially more accurately calculate the precession of the noble gas isotopes in the sensor cell 160. For example, because the NMR sensor system 150 implements the pair of optical probe beams $OPT_{PRB1}$ and $OPT_{PRB2}$, the Faraday rotation of the respective optical probe beams $OPT_{PRB1}$ and $OPT_{PRB2}$ can each be independently measured by the respective photodetector assemblies 166 and 168. Therefore, the precession of the noble gas isotopes in the sensor cell 160 can be measured redundantly. Furthermore, while light having a wavelength at approximately the D2 emission line can result in a greater (e.g., approximately double) Faraday rotation in response to an identical spin polarization vector magnitude and direction from the alkali metal vapor than the D1 emission line, such light having the wavelength at approximately the D2 emission line can also result in greater (e.g., approximately double) contribution to deleterious AC Stark shift effects within the sensor cell 160. However, the contribution to deleterious AC Stark shift effects is associated with optical path propagation and optical polarization. Therefore, because the first and second optical probe beams $OPT_{PRB1}$ and $OPT_{PRB2}$ are counter-propagating optical beams in the example of FIG. 4, the first and second optical probe beams $OPT_{PRB1}$ and $OPT_{PRB2}$ can be configured to substantially cancel their respective contributions to AC Stark shift effects. For example, as described previously, the second optical probe beam $OPT_{PRB2}$ can, at an appropriate wavelength, have an intensity that is approximately twice the intensity of the first optical probe beam $OPT_{PRB1}$. Accordingly, the respective contributions to AC Stark shift effects of the first and second optical probe beams $OPT_{PRB1}$ and $OPT_{PRB2}$ in the sensor cell 160 can be approximately equal and opposite based on the counter-propagation of the first and second optical probe beams $OPT_{PRB1}$ and $OPT_{PRB2}$. As a result, measurement errors resulting from deleterious AC Stark shift effects can be substantially mitigated in the NMR sensor system 150.

It is to be understood that the NMR sensor systems 100 and 150 are not limited to the respective examples of FIGS. 3 and 4. As an example, the NMR sensor systems 100 and 150 are demonstrated as portions of overall sensor systems for simplicity, and can thus include a variety of additional components, such as magnetic field generators, mechanization controllers, and/or other components. As another example, the NMR sensor systems 100 and 150 are not limited to the optical paths demonstrated for the respective optical pump beam OPT$_{PMP}$ and the optical probe beams OPT$_{PRB}$, OPT$_{PRB1}$, and OPT$_{PRB2}$, but can included additional optics for directing the respective optical beams in varying directions. Furthermore, the set of beam optics and detection optics described in the examples of FIGS. 3 and 4 can be combined. For example, the NMR sensor system 150 in the example of FIG. 4 can also include the beam combiner 118, dichromatic mirror 126, and photodetector assembly 128 in the example of FIG. 3. Accordingly, the NMR sensor system 150 can also be configured to substantially stabilize the internal magnetic field in the sensor cell 160, similar to as described in the example of FIG. 3. Furthermore, the wavelengths of the respective pump and probe beams can vary with respect to the D1 and D2 emission lines, such that the optical pump beam OPT$_{PMP}$ can have a wavelength corresponding to the D2 emission line and the collinear portion of the optical probe beam OPT$_{PRB}$ can have a wavelength corresponding to the D1 emission line.

As another example, in the example of FIG. 3, the combining of the optical pump beam OPT$_{PMP}$ and the optical probe beam OPT$_{PRB}$ and the separation of the optical pump beam OPT$_{PMP}$ and the optical probe beam OPT$_{PRB}$ at the sensor cell 110 could be achieved in a different manner than the use of the dichromatic mirrors 122 and 126. For example, the optical probe beam OPTPRB and the optical pump beam OPTPMP can have frequencies that differ by less than the frequencies corresponding to the D1 and D2 emission lines (e.g., a few GHz). Thus, the dichromatic mirror 122 can be replaced by any of a variety of other types of beam combining elements, such as a polarization-independent beamsplitter, to combine the optical pump beam OPT$_{PMP}$ and the optical probe beam OPT$_{PRB}$. For example, a beam combining element that is configured as a polarization-independent beam splitter can combine the optical pump beam OPT$_{PMP}$ and the optical probe beam OPT$_{PRB}$ based on a power distribution of between 50% and 90% for the portion of the optical pump beam OPT$_{PMP}$ relative to the optical probe beam OPT$_{PRB}$ in the combined beam. The dichromatic mirror 126 can thus be replaced by, for example, a high-finesse Fabry-Perot optical cavity to separate the optical probe beam OPT$_{PRB}$ from the combined beam to allow the Faraday rotation of the optical probe beam OPT$_{PRB}$ to be measured. Therefore, the NMR sensor systems 100 and 150 can be configured in a variety of ways.

Figure 5:
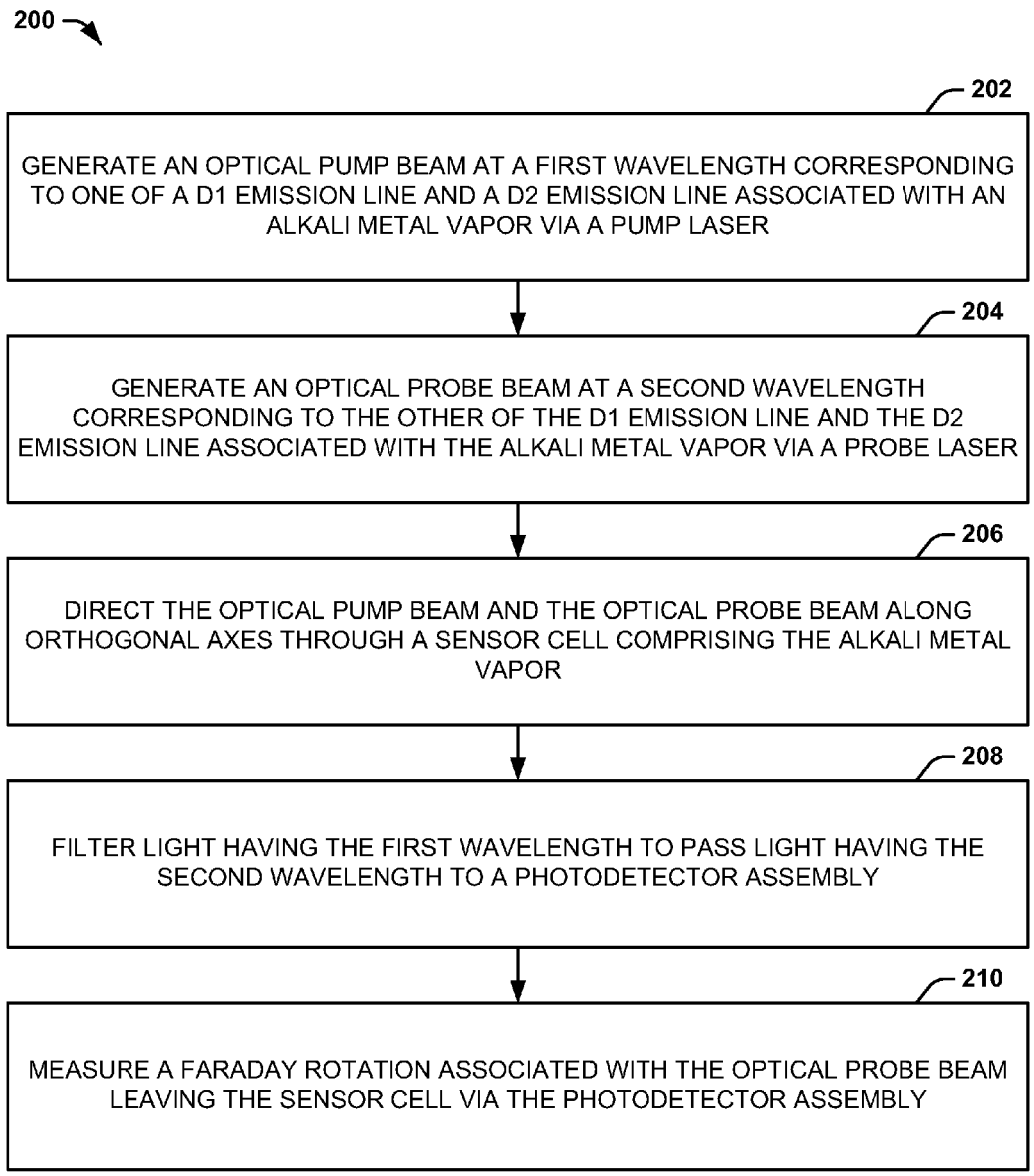
FIG. 5 illustrates an example of a method for measuring an external magnetic field in a nuclear magnetic resonance system.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 200 for measuring an external magnetic field in a nuclear magnetic resonance system (e.g., the NMR system 10). At 202, an optical pump beam (e.g., the optical pump beam OPT$_{PMP}$) is generated at a first wavelength corresponding to one of a D1 emission line and a D2 emission line associated with an alkali metal vapor via a pump laser (e.g., the pump laser 12). At 204, an optical probe beam (e.g., the optical probe beam OPT$_{PRB}$) is generated at a second wavelength corresponding to the other of the D1 emission line and the D2 emission line associated with the alkali metal vapor via a probe laser (e.g., the probe laser 14). At 206, the optical pump beam and the optical probe beam are provided along orthogonal axes through a sensor cell (e.g., the sensor cell 18) comprising the alkali metal vapor. At 208, light having the first wavelength is filtered to pass light having the second wavelength to a photodetector assembly (e.g., the photodetector(s) 22). At 210, a Faraday rotation associated with the optical probe beam leaving the sensor cell is measured via the photodetector assembly. The Faraday rotation can be associated with the external magnetic field.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A nuclear magnetic resonance (NMR) sensor system comprising:
    a pump laser configured to generate an optical pump beam at a first wavelength;
    a probe laser configured to generate an optical probe beam at a second wavelength that is different from the first wavelength;
    beam optics configured to direct the optical pump beam and the optical probe beam along orthogonal axes through a sensor cell comprising an alkali metal vapor; and
    detection optics comprising a photodetector assembly configured to measure at least one characteristic associated with the optical probe beam leaving the sensor cell for measurement of a polarization vector of the alkali metal vapor, the detection optics comprising at least one filter configured to filter light having the first wavelength and to pass light having the second wavelength to the photodetector assembly;
    wherein the beam optics comprise a beam combiner configured to combine at least a portion of the optical probe beam with the optical pump beam, such that the at least portion of the optical probe beam and the optical pump beam are provided substantially collinearly through the sensor cell;
    wherein the beam combiner comprises:
        an optical pickoff configured to split a portion of the optical probe beam from a first optical path that passes through the sensor cell in a first axis; and
        a beam combining element configured to pass the optical pump beam and to reflect the portion of the optical probe beam into a second optical path that comprises the optical pump beam and passes through the sensor cell in a second axis orthogonal to the first axis.

2. The system of claim 1, wherein the first wavelength corresponds to one of a D1 emission line and a D2 emission line associated with the alkali metal vapor, and wherein the second wavelength corresponds to the other of the D1 emission line and the D2 emission line associated with the alkali metal vapor.

3. The system of claim 1, wherein the at least one characteristic associated with the optical probe beam comprises a Faraday rotation associated with the optical probe beam.

4. The system of claim 1, wherein the beam optics comprises:
   a linear polarizer and a quarter-wave plate configured to convert the optical pump beam to a circular polarization; and
   a linear polarizer configured to convert the optical probe beam to a linear polarization.

5. The system of claim 1, wherein the detection optics are configured to measure a Faraday rotation associated with the at least portion of the optical probe beam to substantially stabilize an internal magnetic field associated with the alkali metal vapor in the sensor cell.

6. The system of claim 1, wherein the probe laser is a first probe laser configured to generate a first optical probe beam, and wherein the photodetector assembly is a first photodetector assembly, the system further comprising a second probe laser configured to generate a second optical probe beam at the first wavelength and at an intensity that is approximately twice an intensity of the first optical probe beam, the second optical probe beam being provided in an optical path that is collinear with and counter-propagating with respect to the first optical probe beam.

7. The system of claim 6, wherein the detection optics comprises a second photodetector assembly configured to measure at least one characteristic associated with the second optical probe beam leaving the sensor cell to substantially mitigate effects of an AC Stark shift associated with the measurement of the external magnetic field.

8. An NMR gyroscope system comprising the NMR probe system of claim 1.

9. An atomic magnetometer system comprising the NMR probe system of claim 1.

10. A method for measuring an external magnetic field in a nuclear magnetic resonance system, the method comprising:
   generating an optical pump beam at a first wavelength corresponding to one of a D1 emission line and a D2 emission line associated with an alkali metal vapor via a pump laser;
   generating an optical probe beam at a second wavelength corresponding to the other of the D1 emission line and the D2 emission line associated with the alkali metal vapor via a probe laser;
   splitting the optical probe beam into a first portion and a second portion;
   combining the first portion of the optical probe beam with the optical pump beam to provide a combined beam, such that the combined beam comprises the first portion of the optical probe beam that is substantially collinear with the optical pump beam;
   directing the combined beam and the second portion of the optical probe beam along orthogonal axes through a sensor cell comprising the alkali metal vapor;
   filtering light having the first wavelength to pass light having the second wavelength to a photodetector assembly;
   measuring a Faraday rotation associated with the second portion of the optical probe beam leaving the sensor cell via the photodetector assembly, the Faraday rotation being associated with the external magnetic field;
   measuring a Faraday rotation associated with the first portion of the optical probe beam exiting the sensor cell; and
   adjusting at least one parameter of the nuclear magnetic resonance system based on the Faraday rotation of the first portion of the optical probe beam to substantially stabilize an internal magnetic field associated with the alkali metal vapor in the sensor cell.

11. The method of claim 10, wherein combining the first portion of the optical probe beam with the optical pump beam comprises:
   splitting the first portion of the optical probe beam from a first optical path that passes through the sensor cell in a first axis; and
   passing the optical pump beam and reflecting the second portion of the optical probe beam into a second optical path via a beam combining element to provide the combined beam that passes through the sensor cell in a second axis orthogonal to the first axis.

12. The method of claim 10, wherein adjusting the at least one parameter comprises
   adjusting at least one of intensity of the optical pump beam, temperature of the sensor cell, or the intensity and/or wavelength of the optical probe beam based on the Faraday rotation to substantially stabilize the internal magnetic field associated with the alkali metal vapor in the sensor cell.

13. The method of claim 10, wherein the probe laser is a first probe laser configured to generate a first optical probe beam, the method further comprising:
   generating a second optical probe beam at the first wavelength via a second probe laser, the second optical probe beam having an intensity that is approximately twice an intensity of the first optical probe beam;
   directing the second optical probe beam in an optical path that is collinear with and counter-propagating with respect to the first optical probe beam;
   measuring a Faraday rotation associated with the second optical probe beam leaving the sensor cell via a second photodetector assembly to substantially mitigate effects of an AC Stark shift associated with measurement of the external magnetic field.

14. A nuclear magnetic resonance (NMR) sensor system comprising:
   a sensor cell comprising an alkali metal vapor;
   a pump laser configured to generate an optical pump beam at a first wavelength corresponding to one of a D1 emission line and a D2 emission line associated with the alkali metal vapor;
   a probe laser configured to generate an optical probe beam at a second wavelength corresponding to the other of the D1 emission line and the D2 emission line associated with the alkali metal vapor;
   beam optics comprising:
      a linear polarizer and a quarter-wave plate configured to convert the optical pump beam to a circular polarization;
      a linear polarizer configured to convert the optical probe beam to a linear polarization; and
      additional optics configured to direct the optical pump beam and the optical probe beam along orthogonal axes through the sensor cell; and detection optics comprising a photodetector assembly configured to measure a Faraday rotation associated with the optical probe beam leaving the sensor cell for measurement of a polarization vector of the alkali metal vapor, the detection optics comprising at least one filter configured to filter light having the first wavelength and to pass light having the second wavelength to the photodetector assembly;

wherein the probe laser is a first probe laser configured to generate a first optical probe beam, and wherein the photodetector assembly is a first photodetector assembly, the system further comprising a second probe laser configured to generate a second optical probe beam at the first wavelength and at an intensity that is approximately twice an intensity of the first optical probe beam, the second optical probe beam being provided in an optical path that is collinear with and counter-propagating with respect to the first optical probe beam.

15. The system of claim 14, wherein the beam optics comprise a beam combiner, the beam combiner comprising:

an optical pickoff configured to split a portion of the optical probe beam from a first optical path that passes through the sensor cell in a first axis; and a beam combining element configured to pass the optical pump beam and to reflect the portion of the optical probe beam into a second optical path that comprises the optical pump beam and passes through the sensor cell in a second axis orthogonal to the first axis;

wherein the detection optics are configured to measure a Faraday rotation associated with the portion of the optical probe beam to substantially stabilize an internal magnetic field associated with the alkali metal vapor in the sensor cell.

16. The system of claim 14, wherein the detection optics comprises a second photodetector assembly configured to measure at least one characteristic associated with the second optical probe beam leaving the sensor cell to substantially mitigate effects of an AC Stark shift associated with the measurement of the external magnetic field.

* * * * *